United States Patent
Baillin

(10) Patent No.: US 8,414,963 B2
(45) Date of Patent: Apr. 9, 2013

(54) STRUCTURE COMPRISING A GETTER LAYER AND AN ADJUSTING SUBLAYER AND FABRICATION PROCESS

(75) Inventor: Xavier Baillin, Crolles (FR)

(73) Assignee: Commissariat a l'Energie Atomique, Paris (FR)

( * ) Notice: Subject to any disclaimer, the term of this patent is extended or adjusted under 35 U.S.C. 154(b) by 15 days.

(21) Appl. No.: 12/729,634

(22) Filed: Mar. 23, 2010

(65) Prior Publication Data
US 2010/0178419 A1 Jul. 15, 2010

Related U.S. Application Data

(63) Continuation of application No. 12/679,487, filed as application No. PCT/FR2008/001420 on Oct. 9, 2008.

(30) Foreign Application Priority Data
Oct. 15, 2007 (FR) ..................................... 07 07212

(51) Int. Cl.
*B05D 5/12* (2006.01)

(52) U.S. Cl.
USPC ....................................................... 427/97.3

(58) Field of Classification Search ................. 427/97.3, 427/97.1; 428/51, 64; 438/58, 143, 310, 438/402, 471
See application file for complete search history.

(56) References Cited

U.S. PATENT DOCUMENTS

| 4,127,134 A | 11/1978 | Ushakoff |
| 4,302,498 A | 11/1981 | Faith, Jr. |
| 4,814,945 A | 3/1989 | Leibowitz |
| 5,456,740 A | 10/1995 | Snow et al. |
| 5,577,020 A | 11/1996 | Utsunomiya et al. |
| 5,700,333 A | 12/1997 | Yamazaki et al. |
| 5,866,978 A | 2/1999 | Jones et al. |

(Continued)

FOREIGN PATENT DOCUMENTS

WO  WO 03/028096 A2  4/2003

OTHER PUBLICATIONS

Movchan et al.; "Study of the Structure and Properties of Thick Vacuum Condensates of Nickel, Titanium, Tungsten, Aluminum Oxide and Zirconium Dioxide;" *Phys. Met. Metallogr.*; 1969; pp. 83-90; vol. 28; No. 4.

Thornton; "The microstructure of sputter-deposited coatings;" *J. Vac. Sci. Technol.*; 1986; pp. 3059-3065; vol. 4; No. 6.

International Search Report for International Application No. PCT/FR2008/001420, issued Jun. 8, 2009.

(Continued)

*Primary Examiner* — Michael Cleveland
*Assistant Examiner* — Tabassom Tadayyon Eslami
(74) *Attorney, Agent, or Firm* — Oliff & Berridge, PLC

(57) ABSTRACT

The structure comprises at least a device, for example a microelectronic chip, and at least a getter arranged in a cavity under a controlled atmosphere delineated by a substrate and a sealing cover. The getter comprises at least one preferably metallic getter layer, and an adjustment sub-layer made from pure metal, situated between the getter layer and the substrate, on which it is formed. The adjustment sub-layer is designed to modulate the activation temperature of the getter layer. The getter layer comprises two elementary getter layers.

22 Claims, 2 Drawing Sheets

U.S. PATENT DOCUMENTS

| | | | |
|---|---|---|---|
| 5,943,601 A * | 8/1999 | Usui et al. | 438/688 |
| 6,110,808 A | 8/2000 | Saito | |
| 6,423,575 B1 | 7/2002 | Tran et al. | |
| 6,548,889 B2 | 4/2003 | Saito | |
| 6,923,625 B2 | 8/2005 | Sparks | |
| 7,413,814 B2 | 8/2008 | Conte et al. | |
| 2004/0253476 A1 * | 12/2004 | Conte et al. | 428/660 |
| 2006/0230927 A1 * | 10/2006 | Xie et al. | 95/55 |
| 2008/0171180 A1 * | 7/2008 | Guadagnuolo et al. | 428/173 |

OTHER PUBLICATIONS

Jun. 25, 2012 Office Action issued in U.S. Appl. No. 12/679,487.
Jan. 16, 2013 Office Action issued in U.S. Appl. No. 12/679,487.

* cited by examiner

US 8,414,963 B2

STRUCTURE COMPRISING A GETTER LAYER AND AN ADJUSTING SUBLAYER AND FABRICATION PROCESS

This is a Continuation of application Ser. No. 12/679,487 filed Mar. 23, 2010, which in turn is a U.S. National Stage Application of PCT/FR2008/001420 filed Oct. 9, 2008, which claims the benefit of French Patent Application No. 07 07212 filed Oct. 15, 2007. The disclosure of the prior applications is hereby incorporated by reference herein in its entirety.

BACKGROUND OF THE INVENTION

The invention relates to a structure comprising a closed cavity under a controlled atmosphere wherein there are arranged at least a device and a getter comprising at least one getter layer, the cavity being delineated by a substrate and a sealing cover.

STATE OF THE ART

Integration in a vacuum enables the performances of numerous devices, for example microelectronic devices such as Micro Electro Mechanical Systems (MEMS) to be improved. However, the use of encapsulation in a vacuum gives rise to a number of problems, and in particular preservation of the vacuum level with time and the quality of the encapsulated atmosphere.

In this direction, non evaporable getter (NEG) materials deposited in thin layers have been the subject of numerous publications. These materials react and capture numerous gases with which they are in contact by formation of an oxide, a hydride or then again by simple surface adsorption. In this way, desorption of the materials delineating a cavity in a vacuum is compensated by the getter material layer which adsorbs and/or absorbs the desorbed elements of the other materials.

Integration of non-evaporable getter materials within an encapsulation structure has been described in particular in U.S. Pat. No. 6,923,625. This patent describes the use, on a substrate, of a getter comprising a reactive layer covered by a protective layer. In this document, the protective layer prevents the reactive layer from reacting with the outside environment at ambient temperature. The reactive layer of the getter only acts when its activation temperature is reached, a temperature above which the atoms of the reactive layer diffuse through the protective layer and absorb a part of the gases of the surrounding environment. The activation temperature is an intrinsic characteristic of the getter material.

In a general manner, known monolayer or multilayer getters have an absorption or adsorption capacity that is limited to a set temperature range. In the microsystems field, it is advantageous to be able to dispose of a getter material that is adaptable to the constraints imposed by the technological methods indispensable for producing the device. The constraints can be thermal, in which case a match must be made between the getter material activation temperature and the formation process of a cavity closed by sealing, for example of two substrates on a seal. Furthermore, the getter material has to be able to withstand the gaseous environments that are used in formation of the device while at the same time remaining reactive when the device is used in its closed cavity.

The document WO 03/028096 describes production, on a substrate, of a getter in the form of a thin film constituted by a titanium film deposited on a palladium film. The titanium getter film is formed on an electromagnetic shielding layer made of aluminium or copper.

OBJECT OF THE INVENTION

The object of the invention is to produce a structure wherein the getter presents an optimum pumping capacity in a required temperature range.

According to the invention, this object is achieved by the fact that an adjustment sub-layer of the activation temperature of the getter layer is situated between the getter layer and the substrate and/or the sealing cover whereon it is formed, and that the getter layer is formed by a plurality of elementary getter layers of different compositions arranged above the adjustment sub-layer.

It is a further object of the invention to provide a method for producing such a structure.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

Figure 2:
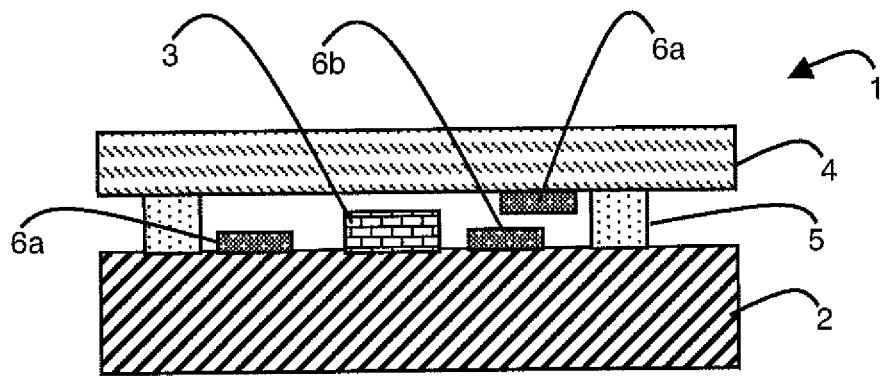
FIGS. 2 and 3 represent schematic cross-sectional views of the structures according to the invention.

As illustrated in FIG. 2, a structure 1 able to be a microelectronics chip conventionally comprises at least a device 3, for example of microelectronics type, arranged in a sealed cavity delineated by two substrates 2 and 4 and by a closed peripheral sealing joint 5. The tightness of the cavity is provided by sealing joint 5 situated between the substrates and that surrounds device 3. Microelectronics device 3 is for example formed on first substrate 2. The cavity is generally at a negative pressure with respect to the outside atmosphere, preferably in a vacuum or under a controlled pressure of nitrogen or argon.

Figure 1:
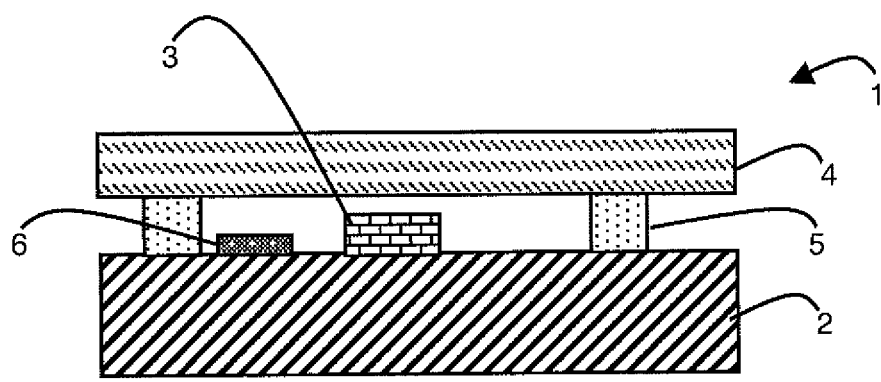
FIG. 1 represents a schematic cross-sectional view of a structure according to the prior art.

Conventionally, the height of the cavity is defined by the height of sealing joint 5 that surrounds device 3 (FIG. 1). However, second substrate 4 can be structured so as to form a cover comprising a thinner central part so as to increase the volume of the cavity.

Second substrate 4 is for example made from silicon, oxidized or nitrided silicon or glass. First substrate 2 is for example made from silicon or any other semi-conducting material, except for gallium arsenide (GaAs), or from another material on which an already formed device can be integrated.

Figure 3:
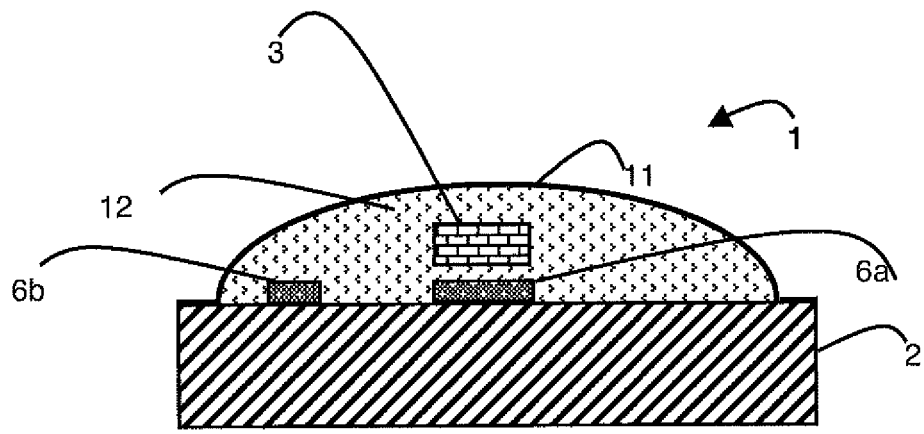

In another embodiment illustrated in FIG. 3, structure 1 comprises a tightly-sealed closed cavity that is delineated by substrate 2 and by an encapsulation layer 11. The tightness of the structure is then ensured by the adhesion between encapsulation layer 11 and substrate 2. The encapsulation layer then acts as sealing cover, like substrate 4 of FIG. 1. The sealing cover can comprise other layers in addition to the encapsulation layer. In the embodiment illustrated in FIG. 3, the height of the cavity is defined by the thickness of sacrificial material 12 deposited on the substrate.

In order to ensure the perenniality of the negative pressure level and/or of the quality of the atmosphere inside the cavity, the cavity comprises at least one getter 6 on at least one of its inside walls. Getter 6 is of multilayer type and comprises at least one adjustment sub-layer 8 situated between one of substrates 2 or 4 and a getter layer 7 which conventionally forms the adsorbent and/or absorbent layer. Getter layer 7 is for example made from a metallic material preferably chosen to have a high nitrogen pumping capacity, this gas being commonly used for encapsulation of devices. If getters 6 present different activation temperatures from one another, it is advantageous to differentiate the latter, for example separating them into getters 6a and additional getters 6b (FIGS. 3 and 4) or first getters 6a and second getters 6b.

Figure 4:
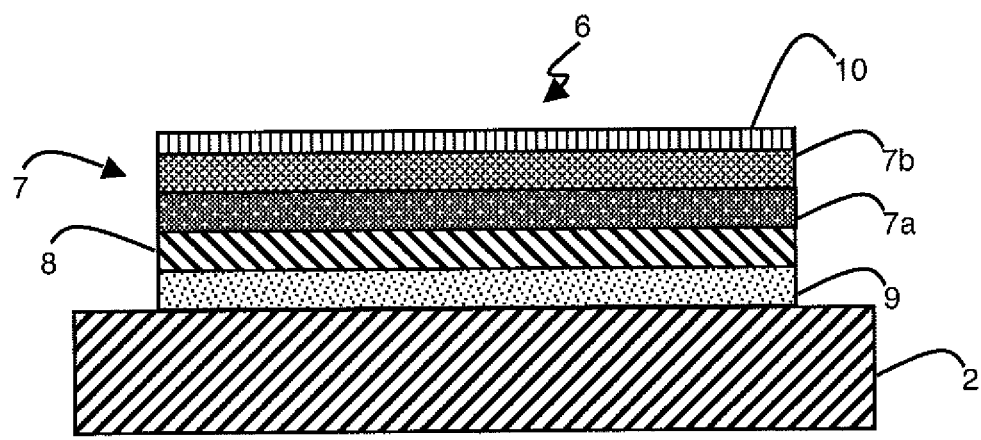
FIG. 4 represents a schematic cross-sectional view of stacking of a multilayer getter of a structure according to the invention.

For example purposes, in FIG. 4, getter 6 is formed on substrate 2. An adhesion sub-layer 9 is advantageously deposited on substrate 2 before adjustment sub-layer 8. Adhesion sub-layer 9 is designed to enhance bonding of adjustment sub-layer 8 on substrate 2. For a silicon substrate, adhesion sub-layer 9 is typically made for example from titanium or zirconium, by means of any suitable technique, and presents a thickness advantageously comprised between 20 and 100 nm.

Adjustment sub-layer 8, situated beneath and in contact with getter layer 7, is designed to enable the activation temperature of the getter layer to be modulated, i.e. it enables the temperature at which the getter layer reacts with the atmosphere present inside the cavity to be modulated. Adjustment sub-layer 8 is preferably made from Cu, Ni, Pt, Ag, Ru, Cr, Au, Al and presents a thickness preferably comprised between 50 and 500 nm when the thickness of getter layer 7a is about a few hundred nanometers, typically between 100 and 2000 nm. The thickness of the adjustment sub-layer can be reduced to a few tens of nanometers, typically between 10 and 90 nm, when the thickness of getter layer 7a is a few hundred nanometers, typically between 100 and 900 nm. For example purposes, an adjustment sub-layer 8 of 30 nm is sufficient for a getter layer 7a of 300 nm. The minimum thickness of adjustment sub-layer 8 is approximately between 5% and 10% of the thickness of getter layer 7a, for example equal to 8%. More generally, adjustment sub-layer 8 is for example made from a metallic material, except for palladium, deposited in pure body state which, like platinum for example, is chemically neutral with respect to getter layer 7 in the required activation range. Adjustment sub-layer 8 can also be made from a material that becomes neutral or that becomes a trap for certain chemical species, for example oxygen, after interaction with getter layer 7. This is in particular the case of copper or nickel, which are able to form an intermetallic compound of $Ti_2Cu$ or $Ti_2Ni$ type with a titanium getter layer, a compound in which oxygen is partially soluble. Adjustment sub-layer 8 can also be made from a material which has a strong chemical affinity for one or more chemical elements from among carbon, oxygen and nitrogen. The sub-layer can for example be made from chromium or aluminium. In the latter case, aluminium sub-layer 8 acts as protection for getter layer 7 when exposed to the ambient air, thereby increasing the storage time of the getter without impairment of its properties, as sub-layer 8 prevents the growth of an oxide layer. This architecture is particularly advantageous for obtaining constant pumping capacities after exposure to the ambient air of several months.

In the presence of an aluminium sub-layer, the getter is directly active without any pre-treatment prior to its use. The activation temperature of a getter stack comprised of an aluminium adjustment sub-layer 8 and a titanium getter layer 7a is about 400° C.

Furthermore, in a particular embodiment, a protective layer 10 can be arranged on getter layer 7 to protect the getter. Getter 6 can thus maintain its pumping capacity after prolonged exposure to the ambient air or be protected from aggressive technological processes which could damage the latter. For example, if an aluminium adjustment sub-layer 8 enables getter 6 to be preserved from the ambient air, a thin layer of chromium acting as protective layer 10 can be used on getter layer 7. The thickness of protective layer 10, for example made from chromium, can be comprised between 10 nm and 50 nm, and advantageously equal to 20 nm. Adding a protective layer 10 contributes to increasing the activation temperature of the getter slightly, typically by about twenty degrees Celsius for a 20 nm chromium layer.

In another embodiment, if the getter is damaged at the surface either by the oxidation occurring during storage in the ambient air or by the aggressive technological processes to which it is exposed during production of the structures, regeneration pre-treatment can easily be implemented. Regeneration pre-treatment consists in exposing the getter in a secondary vacuum, advantageously at a pressure of about $10^{-7}$ mbar or under a partial pressure of a neutral gas not absorbed by the getter, and at a temperature close to its activation temperature for a duration that enables it to absorb the layer which impairs its pumping capacity. The getter is then cooled to the ambient temperature, typically a temperature close to 20° C. In a privileged embodiment that can be combined for example with the foregoing embodiment, before it is exposed to the ambient air, the getter is exposed to a known gas, preferably nitrogen, which will adsorb at the surface and thereby protect the getter temporarily against the ambient air. For example, a temperature of 350° C. is applied for a few hours to regenerate the set of getters 6a described in the present invention.

It may be advantageous to add sacrificial getters deposited on the whole surface of a substrate, for example in the heat treatment vacuum chamber. The sacrificial getter is chosen to have a lower activation temperature than that of getter 6 (or of getters 6a, 6b) that has to be treated when regeneration pre-treatment is performed. The sacrificial getter then serves the purpose of improving the quality of the vacuum in the chamber. Before treatment of the getters is performed, it may be advantageous to flush the chamber with a neutral gas such as argon in order to limit the partial pressures of the residual gases that are liable to react with the getter. The getters can then be subjected to oxidizing atmospheres with which they react and then be regenerated as described above.

Typically, these oxidizing atmospheres are generated when the technological process steps are performed, in particular the steps of eliminating a sacrificial layer of polymer resin. In conventional manner, when producing a structure illustrated in FIG. 3, getter material 7 is subjected to such oxidizing atmospheres. Indeed, getter 6a and device 3 are encapsulated by a sacrificial resin 12 and then by an encapsulation layer 11. The sacrificial resin is shaped for example by heating before encapsulation layer 11 is deposited. The device and getter are released from the layer of sacrificial resin 12 from holes made in encapsulation layer 11. For example, sacrificial resin 12 can be a standard positive-polarity resin used in photolithography and/or a negative-polarity resin of polyimide type. These resins can both be destroyed with a heat treatment in an oxidizing atmosphere. It is then particularly interesting to choose a getter 6 composed of at least one adjustment sub-layer 8 and at least one getter layer 7 such that the activation temperature is greater than the baking temperature of the sacrificial resin. Pollution of the getter by the contaminants originating from the polymer, thereby reducing or even annulling its pumping capacity, is in this way prevented.

This embodiment mode is particularly advantageous for fabrication of MEMS and Infra-Red detectors in order to burn the resin layers on which elements of the microdevice and its encapsulation layer are constructed.

The getter materials are generally exposed to a generally oxidizing dry process treatment with a view to enhancing the propensity of the substrate on which the getter is deposited to direct sealing. This treatment thus contributes to increasing the adhesion energy between the two substrates which delineate the cavity when the latter are brought into contact. In order to limit the effect of the oxidizing treatment, a protective layer 10 of chromium is then recommended. The choice of a getter 6a with a low activation temperature, advantageously lower than 300° C., enables both the sealing to be consolidated and the getter to be activated at a temperature close to 400° C. The getter is thereby activated when the consolidation treatment of the sealing between the two substrates is performed.

Adjustment sub-layer 8 preferably has a coefficient of thermal expansion substantially comprised between $5*10^{-6}/°$ C. and $20*10^{-6}/°$ C., or even $23*10^{-6}/°$ C. for aluminium, and a ratio between its formation temperature Te and its melting temperature Tf (in degrees Kelvin) substantially comprised between 0.1 and 0.3. The activation temperature of the associated getter layer 7 is then an increasing function of the coefficient of expansion of adjustment sub-layer 8 and of ratio Te/Tf and varies in decreasing manner with the melting temperature of adjustment sub-layer 8. It is known that the coefficient of expansion of a metal decreases when the melting temperature of said metal increases. Over a limited temperature range, it is possible to empirically determine the equation that links the activation temperature of getter 6 and the melting temperature of the metal that forms activation sub-layer 8. In particular for the following metals Ru, Cr, Pt, Ni, Au, Cu, Ag, and Al, the equation linking getter activation temperature Ta to melting temperature Tf of the material constituting the adjustment sub-layer is: $Ta=-0.0727*Tf+447$, in which Ta and Tf are expressed in degrees Celsius. In this case, deposition is performed at a temperature close to ambient temperature on a silicon substrate. Although this equation has no physical meaning, it enables the phenomenon to be accounted for.

The effect of adjustment sub-layer 8 on getter layer 7 can be interpreted in the following manner. The getter effect in a metallic material deposited as a thin layer takes place by diffusion of the adsorbed chemical species to the inside of the layer. The getter effect is therefore linked to the microstructure, i.e. to the size, the shape and the orientation of the grains that compose the metallic material. Absorption of the chemical species from the surface to the inside of the getter takes place by diffusion along the grain boundaries. This corresponds to a thermally activated phenomenon that takes place at relatively low temperature in comparison with diffusion of the species in the grains. The structures that are most liable to present a getter effect are therefore those for which the grains are columnar and of small size, thereby enhancing diffusion at the grain boundaries. It is moreover known that the deposition structure depends to a great extent on the ratio between the temperature of the substrate on which the metal is deposited, i.e. the formation temperature (Te), and the melting temperature of the latter (Tf), i.e. the ratio Te/Tf (in degrees Kelvin). The Movchan and Demchisin diagrams (B. A. Movchan, A. V. Demchishin, 1969, Phys. Met. Metallogr., 28, p. 83) on the one hand and those of Thornton (J. A. Thornton, 1986, J. Vac. Sci. Technol., A4(6), p. 3059) on the other hand provide a forecasted mapping of the microstructure according to the ratio Te/Tf and to the pressure. It is apparent according to these diagrams that the zone where the structure of the deposit is of columnar type starts from 0.3 Tf (Tf in degrees Kelvin). For Movchan and Demchisin, below this value the structure is in the form of domes separated by intercolumnar gaps, and above 0.5 Tf the structure becomes more isotropic and equiaxial. Between 0.3 Tf and 0.5 Tf the columnar grains become larger. It is the surface mobility of the atoms, limited at low temperature, which enables the structures obtained under these conditions to be explained. The temperatures that define the transitions between the different types of structure (0.3 Tf and 0.5 Tf) are approximate and act as guidelines only but they do strictly speaking have to be defined empirically for each metal.

On account of the foregoing, if different adjustment sub-layers 8 are made with different metals but under the same temperature conditions Te and pressure conditions, the grain size increases when the ratio Te/Tf increases. For the same formation temperature Te, a ruthenium sub-layer will therefore present a thinner microstructure, and therefore more grain boundaries, than an aluminium sub-layer. Growth of getter layer 7 on sub-layer 8 is partially controlled by the mobility of the getter material atoms at the surface of adjustment sub-layer 8. Due to its microstructure (preferential germination of getter layer 7 at the grain boundaries, triple nodes or nodes between the domes of the underlying structure) and/or its high melting temperature, a ruthenium sub-layer 8 could limit surface migration of the getter metal thereby leading to a thinner structure of the latter than in the opposite case where getter layer 7 is deposited on aluminium.

According to this reasoning, it is therefore possible to modulate activation temperature Ta of getter layer 7 for one and the same adjustment sub-layer 8. The microstructure of adjustment sub-layer 8 simply has to be adjusted according to its formation temperature Te, while remaining within a temperature range that will give the adjustment sub-layer a sufficiently thin structure for the getter to be able to be activated by a diffusion process mostly taking place at the grain boundaries.

In the structures that comprise getters 6 having different activation temperatures from one another, getters 6 can be divided into at least getters 6a and additional getters 6b. In this instance, it is not compulsory for the getter to comprise a getter layer 7 formed by at least two elementary layers 7a and 7b.

Thus, for a structure that comprises at least one getter 6a and an additional getter 6b inside a closed cavity, it is possible to achieve at least one getter 6a and an additional getter 6b having different activation temperatures simply and in industrial manner. The adjustment sub-layer of getter 6a for example presents a larger grain structure than the part of the adjustment sub-layer of additional getter 6b. In other words, the grains of adjustment sub-layer 8 of getter 6a are larger than the grains of adjustment sub-layer 8 of additional getter 6b. The getter layer deposited simultaneously on the two adjustment sub-layers thus presents a finer crystalline microstructure in additional getter 6b than in getter 6a. It is therefore possible to obtain two getters 6a and 6b having two different activation temperatures using the same material for the adjustment sub-layers of the two getters 6a and 6b, but taking care to fabricate the two sub-layers at different temperatures. The two getters 6a and 6b therefore have two different activation temperatures, whether the materials constituting getter layers 7 are identical or not for the two getters.

It is also possible to obtain two getters 6a and 6b having two different activation temperatures using the same material for the getter layer and two different materials as far as the adjustment sub-layer is concerned.

This constitutes an additional technological advantage, since, with the same nature of adjustment sub-layer, it becomes possible to control the getter activation temperature. It can also be envisaged to produce several adjustment sub-layers on one and the same substrate by successive deposition, photolithography and etching operations. Getter layer 7, and protective layer 10 if applicable, are then successively deposited and patterned by photolithography and etching. Getter layer 7, and protective layer 10 if applicable, can then be identical for all the getters.

Adjustment sub-layer 8 being situated between the getter layer and substrate 2, it also enables the chemical interactions between substrate 2 and getter layer 7 to be eliminated. The pumping capacity of getter layer 7 is thereby preserved.

Getter layer 7 deposited on adjustment sub-layer 8 is for example made from Ti or Zr and presents a thickness comprised between 100 and 2000 nm. The activation temperature of the getter layer, without the action of adjustment sub-layer 8, is higher than 425° C. and close to 450° C. With the action of adjustment sub-layer 8, the activation temperature of getter layer 7 varies according to the nature of this adjustment sub-layer 8. The activation temperature of titanium or zirconium getter layer 7 can vary increasingly, substantially between 275 and 425° C., depending on adjustment sub-layer 8.

The table below (table 1) gives values of the activation temperature of a getter 6 according to the nature of its adjustment sub-layer 8 for example purposes for a titanium getter layer 7. All the depositions are performed on a silicon substrate at an identical temperature Te, close to the ambient temperature.

| Nature of adjustment sub-layer 8 | Activation temperature |
|---|---|
| Ru | 275° C. |
| Cr | 300° C. |
| Pt | 325° C. |
| Ni | 350° C. |
| Au | 365° C. |
| Cu | 375° C. |
| Ag | 380° C. |
| Al | 400° C. |

As the melting temperature of zirconium is higher than that of titanium, the zirconium deposition microstructure has to be thinner than that of titanium. The activation temperatures presented in table 1 should therefore be substantially lower with a zirconium getter sub-layer than with a titanium getter layer.

Getter layer 7 is advantageously formed by stacking of a plurality of elementary getter layers, preferably two, 7a, 7b, of different chemical compositions. The elementary getter layers are deposited on top of one another on adjustment sub-layer 8. In the case where two elementary getter layers 7a, 7b are used, first elementary getter layer 7a, in contact with adjustment sub-layer 8, presents a higher activation temperature than that of second elementary getter layer 7b that covers it. Elementary getter layers 7a, 7b thus present a decreasing activation temperature the farther they are located away from adjustment sub-layer 8. Thus, when second getter layer 7b is saturated, heat treatment at the activation temperature of first elementary getter layer 7a enables second elementary getter layer 7b to be regenerated. It is therefore possible to adjust the activation temperature of first elementary getter layer 7a by means of adjustment sub-layer 8 to obtain the required activation temperature, taking account of the activation temperature of second elementary getter layer 7b.

First elementary getter layer 7a, in contact with adjustment sub-layer 8, is preferably made from titanium and has a thickness that is preferably comprised between 100 and 1000 nm. Second elementary getter layer 7b, deposited on elementary getter layer 7a, is then for example made from zirconium and has a thickness preferably comprised between 200 nm and 1000 nm.

The use of two different elementary getter layers 7a, 7b is particularly advantageous for reconditioning the chip in the course of its lifetime by activation of first layer 7a.

Furthermore, adjustment sub-layer 8 of the multilayer getter can be chosen such as to increase the reflectivity of the getter to infrared radiation, typically when the getter is chosen as being an infrared radiation reflector (for certain specific applications). This reflecting function is advantageously chosen, in particular according to the nature of the material of adjustment sub-layer 8 which is advantageously made from copper or aluminium. For example in a bolometer, this reflectivity is sufficient to place the getter as IR reflector. In this case, getter 6 presents another essential function: IR reflector. If the layer is made from titanium, it already has a certain reflectivity to infrared radiation. The use of a suitable adjustment sub-layer then enables the reflectivity to infrared radiation of the whole of the getter to be increased.

Multilayer getter 6 comprising at least adjustment sub-layer 8, getter layer 7 and adhesion sub-layer 9 if applicable can be formed anywhere in the cavity and for example on substrate 2 or 4 before or after formation of micro-electronic device 3. Such a getter 6 can also be formed on the two substrates 2 and 4 delineating the cavity.

Adhesion sub-layer 9 is advantageously deposited by any suitable technique, preferably by evaporation on substrate 2. Adjustment sub-layer 8 and then first and second elementary getter layers (7a, 7b) are then successively deposited, advantageously by evaporation, on adhesion sub-layer 9. Advantageously, the deposition steps of the different layers are performed on the same deposition equipment. Adhesion sub-layer 9 can contribute to improving the quality of the vacuum in this deposition chamber when the material forming this layer (for example Ti or Zr) has getter properties.

Getter 6 can then be patterned in conventional manner, for example by lithography and dry process etching, advantageously by a non-reactive plasma and/or by wet process etching, so as to locate precisely the areas in which getter layers 7 are required. The adhesion of the positive resin used for lithography on getter layer 7 can be improved if necessary by adding an adhesion promoter, advantageously hexadimethylsilazane (HDMS).

Layers 7, 8, 9 and 10 are etched from usual liquid chemical reagents and/or by a neutral plasma according to the materials used. Advantageously getter layer 7 and protective layer 10 can be etched by wet process and the rest of the stack by neutral plasma when wet etching of the adjustment sub-layer is not easy, for example for platinum and ruthenium. The two etching modes can also be used when an incompatibility exists between the etching reagents of the different layers. This incompatibility can lead to over-etching phenomena or even to impairment of certain layers.

The step of removing the positive resin and all or part of the promoter if used can be performed by means of a conventional product used in the micro-electronics industry and advantageously followed by cleaning with fuming nitric acid when the latter does not affect sub-layer 8. At the outcome, dry etching with a non-reactive plasma enables pollutants or residues originating from previous technological steps and present at the surface of getter layer 7 to be eliminated if necessary.

The getter can also be patterned by a lift-off process when deposition is performed. A photosensitive dry film of negative polarity is laminated on the substrate. The dry film with a thickness comprised between 5 and 50 μm, advantageously equal to 15 μm, is exposed and developed by means of a conventional photolithography step. The assembly is then subjected to secondary vacuum treatment for the purpose of eliminating the residues of the development. Deposition of the getter is then performed, for example by sputtering, advantageously by evaporation. Removal of the non-exposed dry film is then performed by means of a specific product which does not modify the properties of the getter material.

By means of the fabrication methods described above, it is possible to successively achieve several getters 6 presenting different activation temperatures on one and the same substrate and/or in one and the same cavity. In the case where patterning of getter 6 is achieved by chemical etching, it is advantageous to deposit and pattern the different adjustment sub-layers 8 of the different getters. Getter layer 7 is then deposited, and is then patterned by chemical etching. As adjustment layer 8 and getter layer 7 are not produced immediately after one another and on the same equipment, it is preferable to use a regeneration pre-treatment as described in the above.

In the case where patterning of getter 6 is achieved by lift-off, successive depositions of getters 6 can be performed by laminating a dry film on an already formed getter. The activation temperature of several different getters can then be adjusted in a single structure.

The surface of the getter being able to be adjusted, the pumping capacity of each getter in terms of number of moles adsorbed or absorbed can be controlled, which enables the pressure inside the cavity that contains the getters to be modulated.

The invention claimed is:

1. A method for fabricating a getter, comprising:
   forming a first adjustment sub-layer in a first material at a first temperature;
   forming a second adjustment sub-layer in the first material at a second temperature different from the first temperature;
   forming, on the first and second adjustment sub-layers, a getter layer, so as to form first and second getters; and
   selecting a ratio between the first or second temperature and a melting temperature of the adjustment sub-layers so as to increase the proportion of grain boundaries in the sub-layer with respect to the proportion of grain boundaries in the getter layer if deposited in absence of the adjustment sub-layers, the increase of the proportion of grain boundaries causing an activation temperature of the getter layers to be shifted with respect to an activation temperature the getters would have had in absence of the adjustment sub-layers.

2. The method according to claim 1, wherein
   the material of the first adjustment sub-layer is selected from the group consisting of Ru, Cr, Pt, Ni, Cu, Al, Ag, and Au; and
   the material of the getter layer is selected from the group consisting of Ti or Zr.

3. The method according to claim 1, wherein
   the first adjustment sub-layer and the getter layer are formed by evaporation; and
   the ratio between the first temperature and the melting temperature of the adjustment sub-layer is substantially between 0.1 and 0.3.

4. The method according to claim 1, wherein the getter layer of the second getter is formed simultaneously with the getter layer of the first getter.

5. The method according to claim 1, further comprising forming a protective layer of chromium on at least the first getter or the second getter.

6. The method according to claim 1, comprising:
   depositing a plurality of getter layers on the first adjustment sub-layer so as to form a stack comprising an external surface formed by one of the getter layers;
   patterning the stack; and
   cleaning the external surface of the stack.

7. The method according to claim 6, further comprising:
   depositing a sacrificial layer of polymer resin so as to encapsulate the stack;
   baking the sacrificial layer of polymer resin at a temperature lower than the activation temperature of the getter layers so as to shape the polymer resin; and
   eliminating the polymer resin with an oxidizing atmosphere.

8. The method according to claim 6, further comprising:
   depositing a sacrificial getter layer on the plurality of getter layers, the getter layer having a lower activation temperature than activation temperatures of the plurality of getter layers;
   heating the first getter so as to cause a reaction of the sacrificial getter layer;
   and removing the sacrificial getter layer.

9. The method according to claim 6, further comprising a pre-treatment heating step of the external surface of the stack in a secondary vacuum at a temperature close to the activation temperature of the getter layer.

10. The method according to claim 6, further comprising a fuming nitric acid cleaning step of the external surface of the stack.

11. The method according to claim 10, further comprising a pre-treatment step comprising a heat treatment in a secondary vacuum with a neutral gas configured to not be absorbed by the first getter or by the second getter.

12. A method for fabricating a getter, comprising:
    forming a first adjustment sub-layer in a first material at a first temperature;
    forming a second adjustment sub-layer in a second material at a second temperature different from the first temperature;
    forming on the first and second adjustment sub-layers, a getter layer made of the first getter material, so as to form first and second getters; and
    selecting a ratio between the first or second temperature and a melting temperature of the first or second adjustment sub-layers, respectively, so as to increase the proportion of grain boundaries in the sub-layer with respect to the proportion of grain boundaries in the getter layer if deposited in absence of the adjustment sub-layers, the increase of the proportion of grain boundaries causing an activation temperature of the getter layers to be shifted with respect to an activation temperature the getters would have had in absence of the adjustment sub-layers.

13. The method according to claim 12, wherein the getter layer of the second getter is formed simultaneously with the getter layer of the first getter.

14. The method according to claim 12, wherein
the material of the first adjustment sub-layer is selected from the group consisting of Ru, Cr, Pt, Ni, Cu, Al, Ag, and Au; and
the material of the getter layer is selected from the group consisting of Ti or Zr.

15. The method according to claim 12, wherein
the first adjustment sub-layer and the getter layer are formed by evaporation; and
the ratio between the first temperature and the melting temperature of the adjustment sub-layer is substantially between 0.1 and 0.3.

16. The method according to claim 12, further comprising forming a protective layer of chromium on at least the first getter or the second getter.

17. The method according to claim 12, comprising:
depositing a plurality of getter layers on the first adjustment sub-layer so as to form a stack comprising an external surface formed by one of the getter layers;
patterning the stack; and
cleaning the external surface of the stack.

18. The method according to claim 17, further comprising a fuming nitric acid cleaning step of the external surface of the stack.

19. The method according to claim 17, further comprising a pre-treatment heating step of the external surface of the stack in a secondary vacuum at a temperature close to the activation temperature of the getter layer forming the external surface of the stack.

20. The method according to claim 17, further comprising:
depositing a sacrificial getter layer on the plurality of getter layers, the sacrificial getter layer having a lower activation temperature than activation temperatures of the plurality of getter layers;
heating the getter so as to cause a reaction of the sacrificial getter layer; and
removing the sacrificial getter layer.

21. The method according to claim 17, further comprising a pre-treatment step comprising a heat treatment in a secondary vacuum with a neutral gas configured to not be absorbed by the first getter or by the second getter.

22. The method according to claim 17, further comprising:
depositing a sacrificial layer of polymer resin so as to encapsulate the stack;
baking the sacrificial layer of polymer resin at a temperature lower than the activation temperature of the getter layers so as to shape the polymer resin; and
eliminating the polymer resin with an oxidizing atmosphere.

* * * * *